April 6, 1971 P. P. CASTRUCCI ET AL 3,573,974
METHOD OF FABRICATING OHMIC CONTACTS
AND CONDUCTIVE CONNECTORS
Filed March 21, 1968

INVENTORS
PAUL P. CASTRUCCI
EDWARD G. GROCHOWSKI

BY J. B. Kraft
ATTORNEY

United States Patent Office 3,573,974

Patented Apr. 6, 1971

3,573,974

METHOD OF FABRICATING OHMIC CONTACTS AND CONDUCTIVE CONNECTORS

Paul P. Castrucci, Poughkeepsie, and Edward G. Grochowski, Wappingers Falls, N.Y., assignors to International Business Machines Corporation, Armonk, N.Y.

Filed Mar. 21, 1968, Ser. No. 714,840
Int. Cl. C23c *11/02;* H01l *7/00*
U.S. Cl. 117—212 9 Claims

ABSTRACT OF THE DISCLOSURE

A method for forming aluminum ohmic contacts and conductive connectors on semiconductor devices having silicon dioxide passivating masks covering portions of a semiconductor substrate. The aluminum contacts and connectors are formed by the disproportionation of aluminum mono-halide vapor in the presence of the silicon dioxide masked substrate. The aluminum formed by the disproportionation is deposited as a layer over the masked substrate. Then, portions of the aluminum layer are selectively removed to leave a pattern of ohmic contacts and conductive connectors.

BACKGROUND OF THE INVENTION (1) Field of the invention

This invention relates to a method for forming ohmic contacts and conductive connectors in semiconductor components, particularly in planar microelectronic semiconductor devices and integrated circuits containing such semiconductor devices.

(2) Description of the prior art

In such planar structures, the active areas of a semiconductor substrate are covered by a passivating mask of silicon dioxide which leaves portions of the device terminals at the surface of the substrate exposed so that ohmic contacts to such terminals may be made. Such ohmic contacts may be conventionally provided by aluminum deposited on the exposed device terminals in the substrate, the aluminum metallization continuing over the surface of the passivating silicon dioxide layer to provide a pattern of conductive connectors.

The aluminum metallization is conventionally formed by depositing a continuous layer of aluminum over the entire masked semiconductor substrate and subsequently selectively removing portions of the aluminum layer by chemical means such as etching. Alternatively, the substrate may be shielded during the deposition of the aluminum by a metal mask or stencil which permits the deposition of aluminum only in the preselected metallization pattern.

Aluminum metallization is presently being conventionally deposited by vacuum evaporation techniques. In a highly evacuated chamber, the aluminum is vaporized from a source such as a crucible or boat containing the aluminum in either the liquid or solid state. The vaporized aluminum deposits as a thin film upon the silicon dioxide masked semiconductor substrate, e.g., a semiconductor wafer. Portions of this aluminum film are then removed by conventional etching techniques utilizing photoresists to provide the desired ohmic contacts and conductive connectors. Such vacuum evaporation techniques have encountered problems in providing good ohmic contacts between the aluminum and semiconductor, e.g., silicon substrate.

Contacts between a metal and semiconductor may be classified into two basic types: ohmic and non-ohmic. At a contact between a metal and a semiconductor, there will be an abrupt discontinuity of the lattice structure. If the curve of electrical resistance is linear and has an equal slope on both sides of this discontinuity, the contact is ideally ohmic. If the curve is seriously nonlinear, the contact is non-ohmic, and may have use as a rectifying contact. In practical semiconductor-diode or transistor device fabrication, the term ohmic contact will functionally describe any contact which allows charge carriers to move freely into and out of the device and does not interfere with the operation of the device. It is very difficult to make completely linear ideal ohmic contacts. For purposes of this specification, an ohmic contact shall therefore be one having substantially linear properties so that no substantial extraneous circuit effect is added by the contact.

The difficulties encountered in providing good ohmic contacts with vacuum evaporation aluminum deposition techniques appear to be related to residual oxides present on the exposed silicon device terminals in the holes in the silicon dioxide mask. Such residual oxides include silicon dioxide which has been incompletely removed during the formation of the silicon dioxide passivating mask. The masks are conventionally made by forming a layer of silicon dioxide on the silicon substrate either by oxidation or deposition and then selectively etching the holes in the device terminal areas by standard photoresist etching techniques. Unfortunately, such techniques do not completely remove the silicon dioxide from the holes. Also, during the formation of the semiconductor device in the substrate by diffusion techniques, small residual amounts of oxide such as boron oxide may be left on the semiconductor substrate. Such residual boron oxide appears to form a borosilicate glass residue on the substrate. When the aluminum is deposited into the holes, these residual oxides and oxide products tend to introduce undesirable rectifying characteristics into the ohmic contacts.

In addition, in the above-described vacuum evaporation techniques for depositing aluminum on semiconductor substrates, it is quite difficult to control the deposition rate of aluminum on the substrate or to maintain a constant rate of deposition. This is due to the fact that the only parameter which is capable of being readily controlled in vacuum evaporation techniques is the temperature of the source. In some instances, the temperature of the substrate has been utilized for control of rate of deposition. Such an approach can only be used within a limited temperature range. Because the rate of deposition is difficult to control, vacuum evaporation techniques are not readily adaptable to continuous operations and are normally carried out as batch processes.

SUMMARY OF THE INVENTION

The present invention provides a method of forming good ohmic aluminum contacts on semiconductor substrates which are not hampered by rectifying characteristics. In the method of the present invention, the rate of aluminum deposition may be readily controlled and the deposition maintained at a constant rate. Accordingly, the present method is readily adaptable to continuous processing.

In the method of the present invention, a passivating mask of silicon dioxide is formed on the semiconductor substrate by any conventional method. Then, aluminum monohalide vapor is disproportionated in the presence of the masked substrate to deposit the aluminum formed on the semiconductor substrate. The aluminum deposited in the holes of the silicon dioxide mask provides ohmic contacts with the device terminals in the substrate. The aluminum monohalide is a strong etchant for oxides and silicates and appears to clean out the residual oxides and silicates remaining in the holes to prevent these materials from interfering with the ohmic contact made by the deposited aluminum. Subsequently, portions of the aluminum layer may be removed from the silicon dioxide passivating mask by conventional photoresist etching techniques to provide a pattern of conductive connectors on the silicon dioxide layer which extends from the ohmic contacts.

The aluminum monohalide employed is preferably aluminum monochloride (AlCl). It is prepared by bringing aluminum chloride ($AlCl_3$), which will be referred to as aluminum trichloride for convenience, in the vapor form into contact with aluminum preferably in the liquid form at a temperature preferably in excess of 900° C. The aluminum monochloride formed is unstable and when brought into contact with the silicon dioxide masked substrate at a lower temperature, preferably in the range of from 300° to 500° C., decomposes to deposit metallic aluminum on the substrate to form the ohmic contacts.

In addition to enhancing the ohmic contacts, the present method provides aluminum contacts for conductive connectors which display excellent adhesion to both the silicon dioxide passivating layer and to the exposed portions of the silicon substrate. This appears to be due to the action of the aluminum monochloride which is a strong etchant for both the silicon dioxide and the silicon.

It is a primary object of this invention to provide a method of forming good ohmic contacts with the exposed device terminals in a semiconductor substrate which has been passivated with a silicon dioxide mask.

It is another object of this invention to provide an aluminum metallization pattern including ohmic contacts and conductive connectors extending from said contacts for a silicon dioxide masked semiconductors substrate.

It is a further object of this invention to provide a method for depositing aluminum metallization on a silicon dioxide masked semiconductor substrate, which method is readily adaptable to continuous deposition techniques.

It is still another object of this invention to provide aluminum metallization for silicon dioxide masked semiconductor substrates which displays excellent adhesion to the substrate.

It is yet another object of this invention to provide a method of depositing aluminum on a semiconductor substrate which is readily controllable so that the deposition may be maintained at a constant rate.

The foregoing and other objects, features and advantages of the invention will be apparent from the following more particular decription and preferred embodiments of the invention as illustrated in the accompanying drawings.

DESCRIPTION OF THE PREFERRED EMBODIMENTS

Figure 1A:
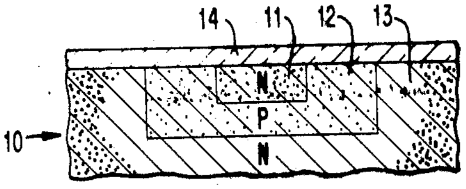
FIGS. 1A through 1D are diagrammatic, cross-sectional views of a portion of a semiconductor substrate containing a device illustrating the steps in the formation of the ohmic contacts and the conductive connectors by the method of the present invention.

Silicon semiconductor substrate 10, in which emitter 11, base 12 and collector 13 regions of a device have been formed by conventional techniques such as double diffusion, is coated with a silicon dioxide passivating layer in the conventional manner, FIG. 1A. This may be accomplished, for example, by epitaxial deposition or by oxidation of the silicon substrate. Since the silicon dioxide masking layer has been utilized in the formation of the semiconducted device, it is only necessary to form sufficient silicon dioxide to close holes in the layer previously opened for diffusion purposes.

Figure 1B:
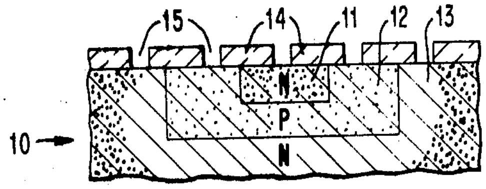

Then, utilizing conventional photoresist and acid etch techniques, holes 15 are opened in silicon dioxide layer 14, FIG. 1B, corresponding to the ohmic contacts to be made with the emitter, base and collector regions of the semiconductor device.

Figure 1C:
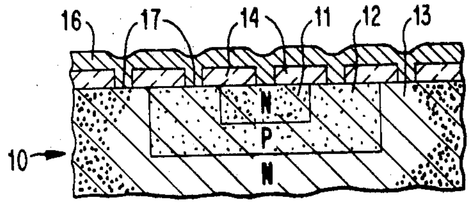
Figure 1D:
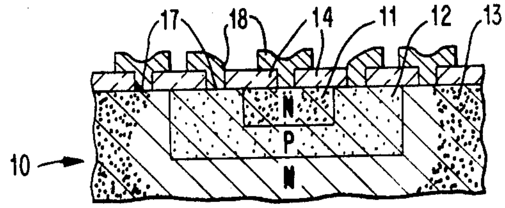
Figure 2:
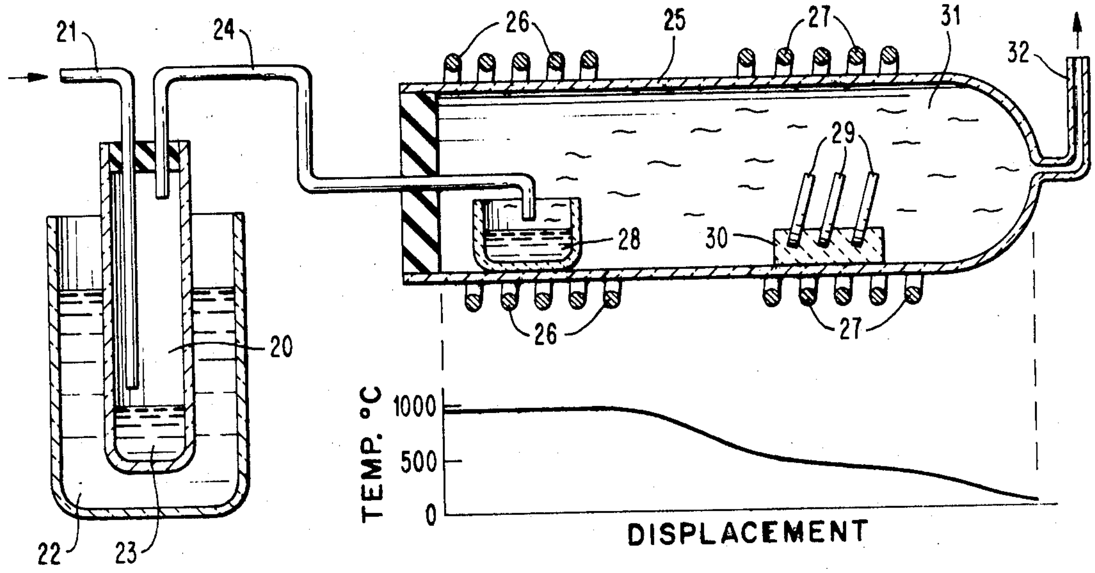
FIG. 2 is a diagrammatic view of apparatus forming the aluminum monochloride and for depositing said aluminum monochloride onto the semiconductor substrate. This figure further includes a graph placed along the length of the refractory tube which indicates the temperature gradient in the tube.

Next, as shown in FIG. 1C, a layer of metallic aluminum 16 is deposited over the silicon dioxode masked semi-conductor substrate. The deposition is carried out by the disproportionation of aluminum monochloride. The apparatus for carrying out the disproportionation is shown in FIG. 2. An inert carrier gas such as argon is fed into vessel 20 by means of intake conduit 21. Solid aluminum trichloride in vessel 20 is maintained at temperature sufficient to be vaporized at a high rate, e.g., a temperature in the order of 140° C., by suitable heating means such as oil bath 22. The argon carrier gas becomes saturated with aluminum trichloride vapor and passes from vessel 20 by means of conduit 24 into refractory tube 25 which is equipped with heat-controlling elements shown in groups of winding, such as group 26 and group 27. The windings may be constructed of any resistance wire or ribbon through which selective power (not shown) may be applied to control the heat in various zones of tube 25. Alternately, the zones may be heated by radio frequency induction heating. The carrier gas from conduit 24 passes through tube 25 at a constant rate. The graph adjacent to the tube indicates the temperature gradient along the length of the tube. The saturated carrier gas entering tube 25 is brought into contact with a source of molten aluminum 28 maintained at a temperature in excess of 900° C. At this temperature, the following reaction takes place:

$$AlCl_{3(v)} + 2Al_{(s)} \xrightarrow{(>900°C.)} 3AlCl_{(v)}$$

The aluminum monochloride formed by this reaction is then carried by the carrier gas down the length of the tube into contact with silicon dioxide masked semiconductor wafers 29 positioned in a suitable fixture 30. These wafers, as indicated in the temperature gradient graph, are at a temperature of between 400° and 500° C. At this temperature, the following reaction will take place at the surface of the wafers:

$$3AlCl_{(v)} \xrightarrow{(>350° \text{ and } <500°C.)} AlCl_{3(v)} + 2Al_{(s)}$$

This second reaction is known as the disporportionation of aluminum monochloride, a relatively unstable compound which undergoes disproportionation at temperatures below 500° C. Metallic aluminum produced by disproportionation is deposited as layer 16 on the silicon masked semicondutor substrate. Aluminum trichloride condenses on the relatively cool tube walls in region 31 and the carrier gas is exited through conduit 32. The condensed aluminum trichloride does not interfere with the process. Several batches of wafers may be processed in the apparatus before it is desirable to clean the aluminum trichloride from the walls of the tube. The removed aluminum trichloride may be reused.

Layer 16 provides good ohmic contact 17 at the interface of layer 16 and the exposed semiconductor device terminals. Portions of aluminum layer 16 are then selectively removed by conventional photoresist etching techniques to leave a pattern of conductive connectors 18 which extend from ohmic contacts 17 along the surface of passivating silicon dioxide layer 14.

While the specific embodiment of this invention has been described with respect to a silicon semiconductor substrate, the method of this invention may be advantageously used in connection with any other semiconductor materials such as germanium which utilize silicon dioxide passivation.

In the deposition of the metallic aluminum, the rate of deposition may be easily controlled by controlling a combination of the source temperature and the rate of flow of the carrier gas. Thus, the method of this invention may be readily adapted to continuous processing of semiconductor substrates. For example, a semiconductor substrate may be moved through a zone maintained at a temperature of from 400° to 500° C. through which the inert carrier gas containing the aluminum monochloride is being passed. The aluminum layer may be deposited onto the semiconductor substrate at a predetermined thickness by fixing the rate of flow of the carrier gas through the zone so that the desired thickness of the aluminum layer is deposited during the residence time of the semiconductor substrate in the zone. In addition, the grain size of the deposited aluminum may be controlled by controlling the wafer temperature.

While aluminum monochloride is preferred, other aluminum monohalides such as aluminum monobromide and aluminum monoiodide may also be used to deposit the aluminum in the process of this invention. Such alternative aluminum monohalides are formed in a manner similar to the formation of the aluminum monochloride.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for depositing a pattern of aluminum ohmic contacts on a silicon substrate comprising:
- forming a mask of silicon dioxide covering portions of said substrate, and
- disproportionating aluminum monohalide vapor in the presence of said masked substrate to etch out any remaining silicon dioxide deposits on the uncovered portions of the substrate and to deposit the aluminum formed by the disproportionation on the uncovered portions, both the etching and the deposition being carried out at the same pressure.

2. The method of claim 1 wherein said monohalide is aluminum monochloride.

3. The method of claim 2 wherein said disproportionation is carried out by contacting said vapor with said substrate having a temperature of from 350° to 500° C.

4. The method of claim 6 wherein said disproportionation is carried out by contacting said vapor with said substrate having a temperature of from 350° to 500° C.

5· A method for depositing a pattern of aluminum ohmic contacts and conductive connectors on a substrate comprising:
- forming a mask of silicon dioxide on a silicon substrate,
- disproportionating aluminum monohalide vapor in the presence of said masked substrate to etch out any remaining silicon dioxide deposits on the uncovered portions of the substrate and to deposit a layer of the aluminum formed by the disproportionation on said masked substrate, both the etching and the deposition being carried out at the same pressure, and
- selectively removing portions of said aluminum layer to provide said pattern.

6. The method of claim 5 wherein said monohalide is aluminum monochloride.

7. A method for forming aluminum ohmic contacts on semiconductor structures comprising:
- coating a semiconductor substrate with a silicon dioxide layer,
- selectively removing portions of said layer by etching to leave a mask of silicon dioxide, and
- disproportionating aluminum monohalide vapor in the presence of the masked substrate to etch out any remaining silicon dioxide deposits on the uncovered portions of the substrate and to deposit aluminum formed by the disproportionation in contact with the unmasked portions of the semiconductor substrate, both the etching and the deposition being carried out at the same pressure.

8. The method of claim 7 wherein said disproportionation is carried out by contacting said vapor with said substrate having a temperature of from 350° to 500° C.

9. A method for forming aluminum ohmic contacts and conductive connectors on semiconductive structures comprising:
- coating a semiconductor substrate with a silicon dioxide layer,
- selectively removing portions of said layer by etching to leave a mask of silicon dioxide,
- disproportionating aluminum monohalide vapor in the presence of the masked substrate to etch out any remaining silicon dioxide deposits on the uncovered portions of the substrate and to deposit a layer of aluminum formed by the disproportionation on said masked substrate, both the etching and the deposition being carried out at the same pressure, and
- selectively removing portions of said aluminum layer to provide a pattern of aluminum connections.

References Cited

UNITED STATES PATENTS

| | | | |
|---|---|---|---|
| 3,460,985 | 8/1969 | Sirtl | 156—17 |
| 3,442,012 | 5/1969 | Murray | 117—217X |
| 2,995,473 | 8/1961 | Levi | 117—212 |
| 2,969,296 | 1/1961 | Walsh | 17—212X |
| 2,886,469 | 5/1959 | Fitzer | 117—107.2 |

ALFRED L. LEAVITT, Primary Examiner

A. GRIMALDI, Assistant Examiner

U.S. Cl. X.R.

117—107.2; 156—17